US012585106B2

(12) United States Patent
Moidu et al.

(10) Patent No.: US 12,585,106 B2
(45) Date of Patent: Mar. 24, 2026

(54) MEMS MIRROR FOR COUPLING AND COMPENSATING LASER DEVICE TO PHOTONIC INTEGRATED CIRCUIT

(71) Applicant: Cisco Technology, Inc., San Jose, CA (US)

(72) Inventors: Jaleel Moidu, Ottawa (CA); John Heanue, Manchester, MA (US)

(73) Assignee: Cisco Technology, Inc., San Jose, CA (US)

( * ) Notice: Subject to any disclaimer, the term of this patent is extended or adjusted under 35 U.S.C. 154(b) by 404 days.

(21) Appl. No.: 18/174,338

(22) Filed: Feb. 24, 2023

(65) Prior Publication Data

US 2024/0288679 A1 Aug. 29, 2024

(51) Int. Cl.
*G02B 26/08* (2006.01)
*B81B 7/02* (2006.01)
*G02B 6/12* (2006.01)

(52) U.S. Cl.
CPC ............ *G02B 26/0833* (2013.01); *B81B 7/02* (2013.01); *G02B 6/12004* (2013.01); *B81B 2201/042* (2013.01); *B81B 2207/01* (2013.01)

(58) Field of Classification Search
CPC .. G02B 26/0833; G02B 6/12004; G02B 6/12; G02B 6/4219; G02B 6/422; G02B 6/4234; G02B 6/425; G02B 6/4286; G02B 7/005; G02B 6/4204; B81B 7/02; B81B 2201/042; B81B 2207/01
See application file for complete search history.

(56) References Cited

U.S. PATENT DOCUMENTS

| | | | |
|---|---|---|---|
| 2002/0064192 A1 | 5/2002 | Missey et al. | |
| 2006/0239605 A1* | 10/2006 | Palen | G02B 6/423 |
| | | | 385/33 |
| 2007/0268553 A1 | 11/2007 | Schneider et al. | |
| 2018/0348455 A1* | 12/2018 | Yasumura | G02B 6/12002 |
| 2021/0157067 A1 | 5/2021 | Moebius et al. | |

OTHER PUBLICATIONS

European Search Report for corresponding European Patent Application No. 2415865.7 dated Jun. 27, 2024.

* cited by examiner

*Primary Examiner* — Euncha P Cherry

(74) *Attorney, Agent, or Firm* — Patterson + Sheridan, LLP

(57) ABSTRACT

Disclosed is an opto-electronic module including a first substrate, a photonic integrated circuit (PIC) attached to the first substrate, a laser assembly attached to the first substrate, and a microelectromechanical systems (MEMS) micro-mirror device positioned between the laser and the waveguide. The PIC comprising a waveguide. The laser assembly is configured to generate a laser beam to optically couple to the waveguide. The laser assembly includes a thermal electric cooler (TEC) and a laser thermally coupled to the TEC. The MEMS micro-mirror device comprising an actuatable MEMS mirror and a fixed mirror.

20 Claims, 7 Drawing Sheets

MEMS MIRROR FOR COUPLING AND COMPENSATING LASER DEVICE TO PHOTONIC INTEGRATED CIRCUIT

FIELD

This disclosure relates generally to the field of photonic systems and more particularly relates to a MEMS (Micro-Electrical-Mechanical-System) mirror for coupling and compensating a laser device to a photonic integrated circuit (PIC).

BACKGROUND

Contemporary optical communications and other photonic systems make extensive use of photonic integrated circuits that are advantageously mass-produced in various configurations for various purposes. Co-packaging a laser with a PIC in a small form factor pluggable module is desirable from a cost reduction, density, and vertical integration/space utilization, manufacturing automation, perspective. In a co-packaged configuration, the laser can be integrated with the PIC, along with a thermo-electric cooler (TEC) for temperature control. A laser beam is coupled to the PIC through a coupling lens arrangement; the laser beam is collimated by a collimating lens (CL) and then focused onto the PIC waveguide by a focusing lens (FL).

An alignment process involves actively aligning the focusing lens to achieve optimal coupling through power feedback during the alignment process. Generally, however, post alignment the focusing lens is fixed in place by an adhesive, and there is a typically a beam shift associated with the adhesive curing process, known as post cure shift, introducing a coupling penalty. Furthermore, free space optical coupling is sensitive to thermo-mechanical deformations due to forces resulting from mismatch in the coefficient of thermal expansion (CTE) between optical components, or mechanical forces resulting from thermal interface materials. The latter being especially the case for opto-electronic multichip modules (OE-MCM) soldered to a printed circuit board (PCB).

Conventional configurations of co-packaged laser assemblies can include a TEC mounted on a substrate, which in turn is attached to one of a PIC. A laser beam is collimated by a collimating lens, and focused onto the PIC by a focusing lens. Final active alignment of the focusing lens may be done by top side access (e.g., a hole defined in the substrate), but there is a coupling penalty due to any cure shift of the focusing lens. There is also a cost associated with the active alignment system, capital, and labor. The stability of the coupling is affected by any post-alignment deformation due to thermo-mechanical forces. Another disadvantage is that, when one considers a multi-channel system, final active alignment of the focusing lens is difficult due to lack of space to accommodate multiple individual lenses with top side access. The insertion of an actuatable MEMS potentially can addresses all of these shortcomings.

A MEMS mirror can be employed to compensate for post-cure shifts resulting in defocusing the laser beam into the PIC waveguide. A standalone OE-MCM can be assembled with a co-packaged laser and then attached by reflow soldering. The active alignment process can be eliminated completely by passively attaching the laser, lens arrangement, and the PIC, without any compensating element. However, this is practically unachievable due to tolerances. Typical passive attach tolerances are of the order of 10 μm, while optical coupling requires sub-micron alignment. Scaling a co-packaged module to multi-channels is difficult due to limited space availability in dense small form factor modules.

SUMMARY

In part, in one aspect, the disclosure relates to an opto-electronic module comprising a first substrate, a photonic integrated circuit (PIC) attached to the first substrate, a laser assembly attached to the first substrate, and a microelectromechanical systems (MEMS) micro-mirror device positioned between the laser and the waveguide. The PIC comprises a waveguide. The laser assembly is configured to generate a laser beam to optically couple to the waveguide. The laser assembly comprises a thermal electric cooler (TEC) and a laser thermally coupled to the TEC. The MEMS micro-mirror device comprises an actuatable MEMS mirror and a fixed mirror.

In another aspect, the disclosure relates to an opto-electronic module wherein the actuatable MEMS mirror is configured to reflect an incident laser beam to the fixed mirror and the fixed mirror is configured to reflect an incident laser beam into the waveguide.

In another aspect, the disclosure relates to an opto-electronic module wherein the fixed mirror is configured to reflect an incident laser beam to the actuatable MEMS mirror and the actuatable MEMS mirror is configured to reflect an incident laser beam into the waveguide.

In another aspect, the disclosure relates to an opto-electronic module wherein the laser assembly comprises a collimating lens optically coupled to the laser and positioned between the laser and the MEMS micro-mirror device.

In another aspect, the disclosure relates to an opto-electronic module comprising a focusing lens positioned between the MEMS micro-mirror device and the waveguide. The focusing lens is configured to focus the laser beam into the waveguide. In yet another aspect, the disclosure relates to an opto-electronic module comprising an optical isolator positioned between the MEMS micro-mirror device and the focusing lens. In yet another aspect, the disclosure relates to an opto-electronic module wherein the actuatable MEMS mirror has one, two, or three degrees of freedom to adjust the laser beam into the focusing lens.

In another aspect, the disclosure relates to an opto-electronic comprising a photodetector coupled to the waveguide, a controller coupled to the photodetector, and a mirror driver coupled to the controller and to the actuatable MEMS mirror.

In another aspect, the disclosure relates to an opto-electronic module wherein the photodetector is configured to monitor the laser beam coupled by the waveguide and provide a signal to the controller to adjust the actuatable MEMS mirror to align the laser beam into the waveguide.

In another aspect, the disclosure relates to an opto-electronic module wherein the controller is configured to control the mirror driver to apply a compensating current or voltage to electrodes on the actuatable MEMS mirror to scan an laser beam incident on the actuatable MEMS mirror to align the laser beam into the waveguide.

In part, in one aspect, the disclosure relates to an opto-electronic module comprising a first substrate, a photonic integrated circuit (PIC) attached to the first substrate, a plurality of laser assemblies attached to the first substrate, and a plurality of microelectromechanical systems (MEMS) micro-mirror devices. The PIC comprises a waveguide. The plurality of laser assemblies is configured to generate a laser beam to optically couple to the waveguide. Each of the plurality of MEMS micro-mirror devices is positioned between the laser and the waveguide. Each of the plurality of MEMS micro-mirror devices comprises an actuatable MEMS mirror and a fixed mirror. Each of the plurality of laser assemblies comprises a thermal electric cooler (TEC) and a laser thermally coupled to the TEC.

In another aspect, the disclosure relates to an opto-electronic module wherein each of the plurality of the actuatable MEMS mirrors is configured to reflect an incident laser beam to the fixed mirror and the fixed mirror is configured to reflect an incident laser beam into the waveguide.

In another aspect, the disclosure relates to an opto-electronic module wherein each of the plurality of fixed mirrors is configured to reflect an incident laser beam to the actuatable MEMS mirror and the actuatable MEMS mirror is configured to reflect an incident laser beam into the waveguide.

In another aspect, the disclosure relates to an opto-electronic module comprising a plurality collimating lenses. At least one of the plurality collimating lenses is optically coupled to at least one of the plurality of lasers and positioned between the at least one of the plurality of lasers and at least one of the plurality of the MEMS micro-mirror devices.

In another aspect, the disclosure relates to an opto-electronic module comprising a plurality of focusing lenses. At least one of the plurality of focusing lenses is positioned between at least one of the plurality of the MEMS micro-mirror devices and the waveguide. At least one of the focusing lenses is configured to focus the laser beam into the waveguide.

In another aspect, the disclosure relates to an opto-electronic module comprising a plurality of optical isolators. At least one of the plurality of optical isolators is positioned between at least one of the MEMS micro-mirror devices and at least one of the focusing lenses.

In another aspect, the disclosure relates to an opto-electronic module wherein the actuatable MEMS mirror has one, two, or three degrees of freedom to adjust the laser beam into at least one of the plurality of focusing lenses.

In another aspect, the disclosure relates to an opto-electronic module comprising a first substrate, a photonic integrated circuit (PIC) attached to the first substrate, a plurality of laser assemblies attached to the first substrate, a plurality of microelectromechanical systems (MEMS) micro-mirror devices, a plurality of photodetectors coupled to the waveguide, a controller coupled to the plurality of photodetectors, and a plurality of mirror drivers coupled to the controller. The PIC comprising a waveguide. The plurality of laser assemblies is configured to generate a laser beam to optically couple to the waveguide. Each of the plurality of laser assemblies comprises a thermal electric cooler (TEC) and a laser thermally coupled to the TEC. Each of the plurality of MEMS micro-mirror devices is positioned between the laser and the waveguide. Each of the plurality of MEMS micro-mirror devices comprising an actuatable MEMS mirror and a fixed mirror. At least one of the plurality of mirror drivers is coupled to at least one of the actuatable MEMS mirrors.

In another aspect, the disclosure relates to an opto-electronic module wherein at least one of the photodetectors is configured to monitor at least one of the laser beams coupled by the waveguide and provide a signal to the controller to adjust at least one of the actuatable MEMS mirrors to align the at least one laser beams into the waveguide.

In another aspect, the disclosure relates to an opto-electronic module wherein the controller is configured to control at least one of the plurality of mirror drivers to apply a compensating current or voltage to electrodes on at least one of the actuatable MEMS mirrors to scan at least one laser beam incident on the at least one of the actuatable MEMS mirrors to align the at least one of the laser beams into the waveguide. Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used comprising laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
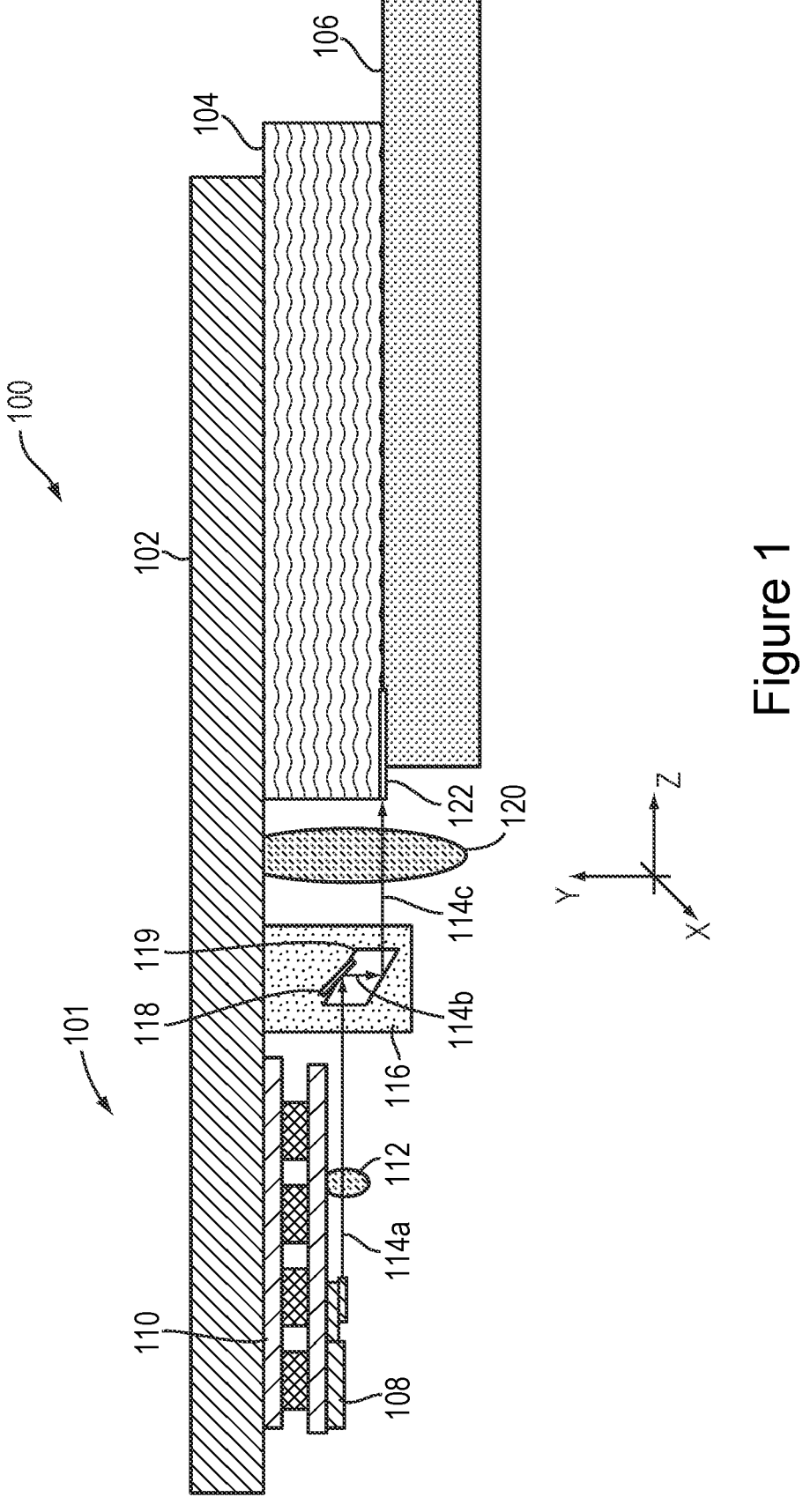
FIG. 1 is a sectional view of an opto-electronic module comprising actuatable MEMS micro-mirror device positioned between a collimating lens and a focusing lens, according to an exemplary embodiment of the disclosure.

This disclosure overcomes the shortcomings in optical alignment and scaling of conventional co-packaged modules as discussed above by introducing an actuatable MEMS mirror as a compensating element between the laser and the PIC. The MEMS mirror can be configured to provide the necessary degree of freedom in angular rotations, in two axes, and/or axial movement, to fully compensate any misalignment between the laser and the PIC through active feedback using monitoring diodes on the PIC. In accordance with one aspect of this disclosure, the laser, lens arrangement, and PIC can be passively aligned with coarse tolerances, and a MEMS mirror can be used to compensate for optical misalignments. Any small misalignments due to post-cure shift, or due to thermo-mechanical forces during operation can be compensated and the coupled power can be maintained over the life of the co-packaged module device. This solution can be readily scaled by a MEMS mirror array and a lens array.

A MEMS micro-mirror device is a device that contains an optical MEMS. The optical MEMS micro-mirror device may comprise an elliptical, cylindrical, rectangular, square, or random shape micro-mirror that is adapted to move and to deflect light over time. The micro-mirror is connected by torsional arms to a fixed part and can tilt and oscillate along one or two axis. For example it can oscillate vertically and horizontally. Different actuation principles can be used, including electrostatic, thermal, electro-magnetic, or piezo-electric. MEMS micro-mirror devices are known in which the area of these micro-mirrors are around a few mm². In this case, the dimensions of the MEMS micro-mirror device, comprising the packaging, can be about ten mm². MEMS micro-mirror devices usually can be made of silicon (Si), and can be encapsulated in a package that can include the driving actuation electronics. Various optical components, such as for example lenses, beam combiner, quarter-wave plates, beam splitter, and laser chips, are assembled with the packaged MEMS to build a complete system.

MEMS micro-mirror devices can be dynamically or statically operated. In a dynamic operation the MEMS micro-mirror continuously oscillates about its oscillation axis/axes during use. Alternatively, in static operation the MEMS micro-mirror device does not oscillate continuously about its oscillation axis/axes. Rather, in static operated MEMS micro-mirror devices the MEMS micro-mirror is tilted about its oscillation axis/axes to a predefined angular position and the MEMS micro-mirror remains at this predefined angular position.

It will be understood that the MEMS micro-mirror devices shown in FIGS. 1-8 can be operated as a dynamic MEMS micro-mirror device or a static operated MEMS micro-mirror device. If operated as a dynamic MEMS micro-mirror device the MEMS micro-mirror is continuously oscillated about its oscillation axis/axes, such as in a low frequency dither mode in a continuous feedback loop, and if operated as a static MEMS micro-mirror device the MEMS micro-mirror is tilted about its oscillation axis/axes to a predefined angular position and the MEMS micro-mirror remains at this predefined angular position.

Figure 2:
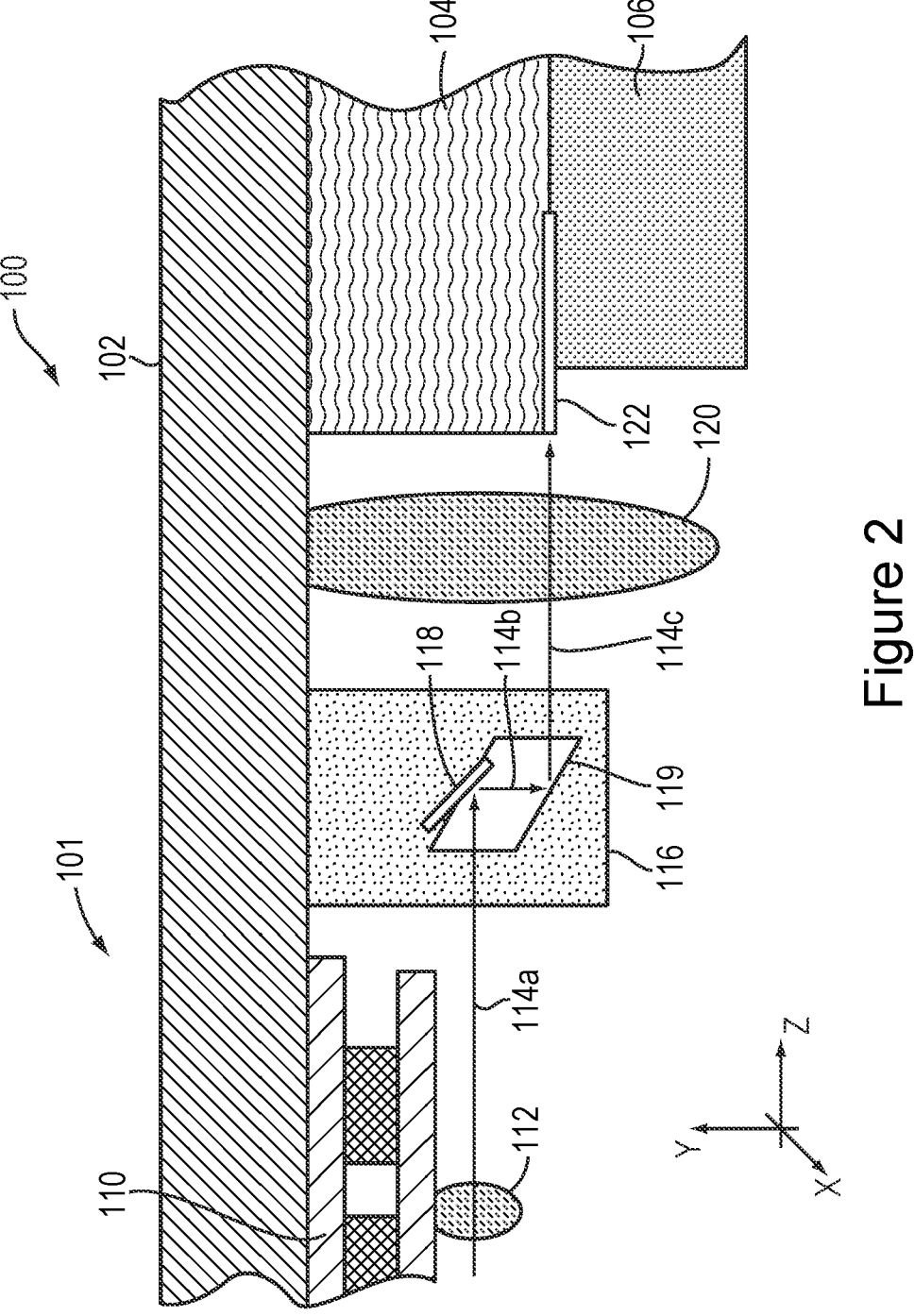
FIG. 2 is a detailed view of the opto-electronic module shown in FIG. 1, according to an exemplary embodiment of the disclosure.

Turning now to figures where there are shown several embodiments of a MEMS mirror for coupling a laser device to a PIC and compensating a laser beam focused onto the PIC waveguide, where FIG. 1 is a sectional view of an opto-electronic module 100 comprising a MEMS micro-mirror device 116 positioned between a collimating lens 112 and a focusing lens 120, according to an exemplary embodiment of the disclosure. FIG. 2 is a detailed view of the opto-electronic module 100 shown in FIG. 1, according to an exemplary embodiment of the disclosure. With reference now to FIGS. 1 and 2, the opto-electronic module 100 comprises a first substrate 102. In one embodiment, the first substrate 102 can be an AlN/Silicon substrate. A PIC 104 comprises one side attached to the first substrate 102 and another, opposite, side attached to a second substrate 106. In one embodiment, the second substrate 106 can be an organic substrate. In one embodiment, the PIC 104 can be configured as a flip-chip for electrically interconnecting the PIC 104 to the first or second substrate 102, 106. In one embodiment, the opto-electronic module 100 comprises a co-packaged laser assembly 101.

In one embodiment, the co-packaged laser assembly 101 comprises a thermo-electric cooler 110 (TEC) is attached to the first substrate 102. A laser 108 is attached to and thermally coupled to the TEC 110. During operation, the laser 108 generates an input laser beam 114a that passes through the collimating lens 112 and enters the MEMS micro-mirror device 116. The MEMS micro-mirror device 116 comprises an actuatable MEMS mirror 118 and a fixed mirror 119. The actuatable MEMS mirror 118 reflects the input laser beam 114a to produce a reflected laser beam 114b, which reflects off the fixed mirror 119 to produce an output laser beam 114c. The output laser beam 114c passes through the focusing lens 120 and enters the PIC 104 waveguide 122.

In the embodiment illustrated in FIGS. 1 and 2, all optical elements are attached passively within about +/−25 μm positional accuracy with respect to fiducials on the first substrate 102. The actuatable MEMS mirror 118 can tilt in two axes, providing the ability to scan the input laser beam 114a in the vertical (Y axis) and horizontal (X axis) directions. The third axis (Z) is less sensitive optically and a passive alignment accuracy of 25 μm is sufficient. In another embodiment, the actuatable MEMS mirror 118 may be have an additional degree of freedom (DOF), referred to herein as pistoning, to compensate for the Z-axis as well. Accordingly, the actuatable MEMS mirror 118 can have one to three degrees of freedom to control pitch, yaw, and pistoning of the actuatable MEMS mirror 118 to adjust the output laser beam 114c into the focusing lens 120.

Once all the optical components (e.g., collimating lens 112, MEMS micro-mirror device 116, and focusing lens 120) are passively aligned, the actuatable MEMS mirror 118 may be actuated to scan the input laser beam 114a incident on the actuatable MEMS mirror 118 to align the output laser beam 114c for optimal coupling into the waveguide 122, by way of monitoring a photodiode on the PIC 104. A feedback scheme can be implemented, for instance by a slow dither of the actuatable MEMS mirror 118 to compensate for any shift of the input laser beam 114a that may occur due to thermo-mechanical forces over the life of the opto-electronic module 100. A typical angular range required for scanning the input laser beam 214a is +/−2 degrees for +/−50 μm scanning.

In one embodiment, the actuatable MEMS mirror 118 is bi-directional in both axes, e.g., two electrodes for each axis, or four electrodes per channel. In one embodiment, the initial passive alignment can be biased to enable a unidirectional MEMS mirror, assuming twice the angular range. This has the advantage of reducing electrode count and simplifying the MEMS driver electronics. The actuatable MEMS mirror 118 can be configured to operate at <40V, for example, to simplify the MEMS driver electronics. In one embodiment, this may be accomplished by efficient staggered vertical comb (SVC) actuators, for example.

Figure 3:
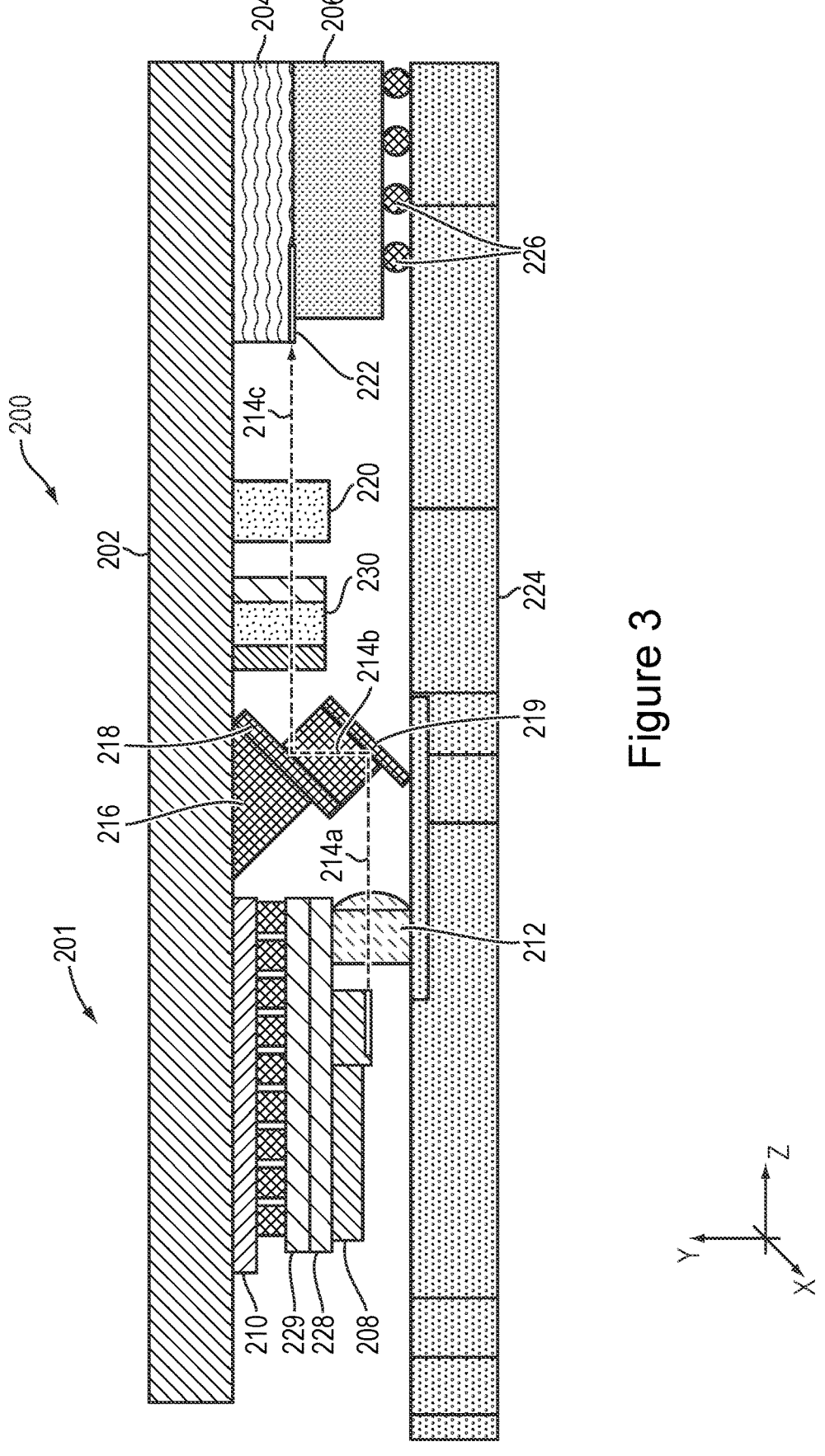
FIG. 3 is a sectional view of a single channel opto-electronic module comprising actuatable MEMS micro-mirror device positioned between a collimating lens and a focusing lens, according to an exemplary embodiment of the disclosure.
Figure 4:
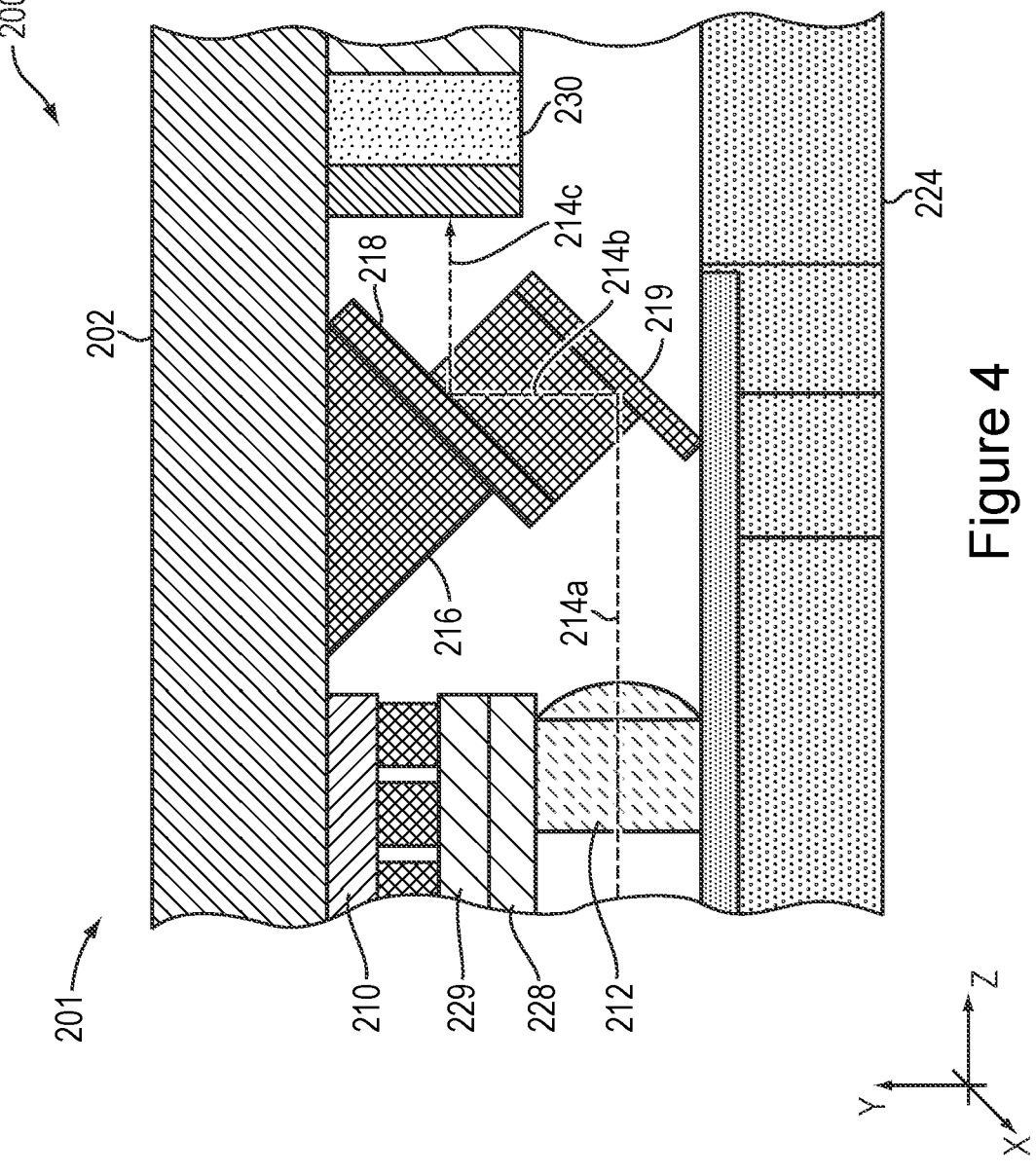
FIG. 4 is a detailed view of the single channel opto-electronic module shown in FIG. 3, according to an exemplary embodiment of the disclosure.
Figure 5:
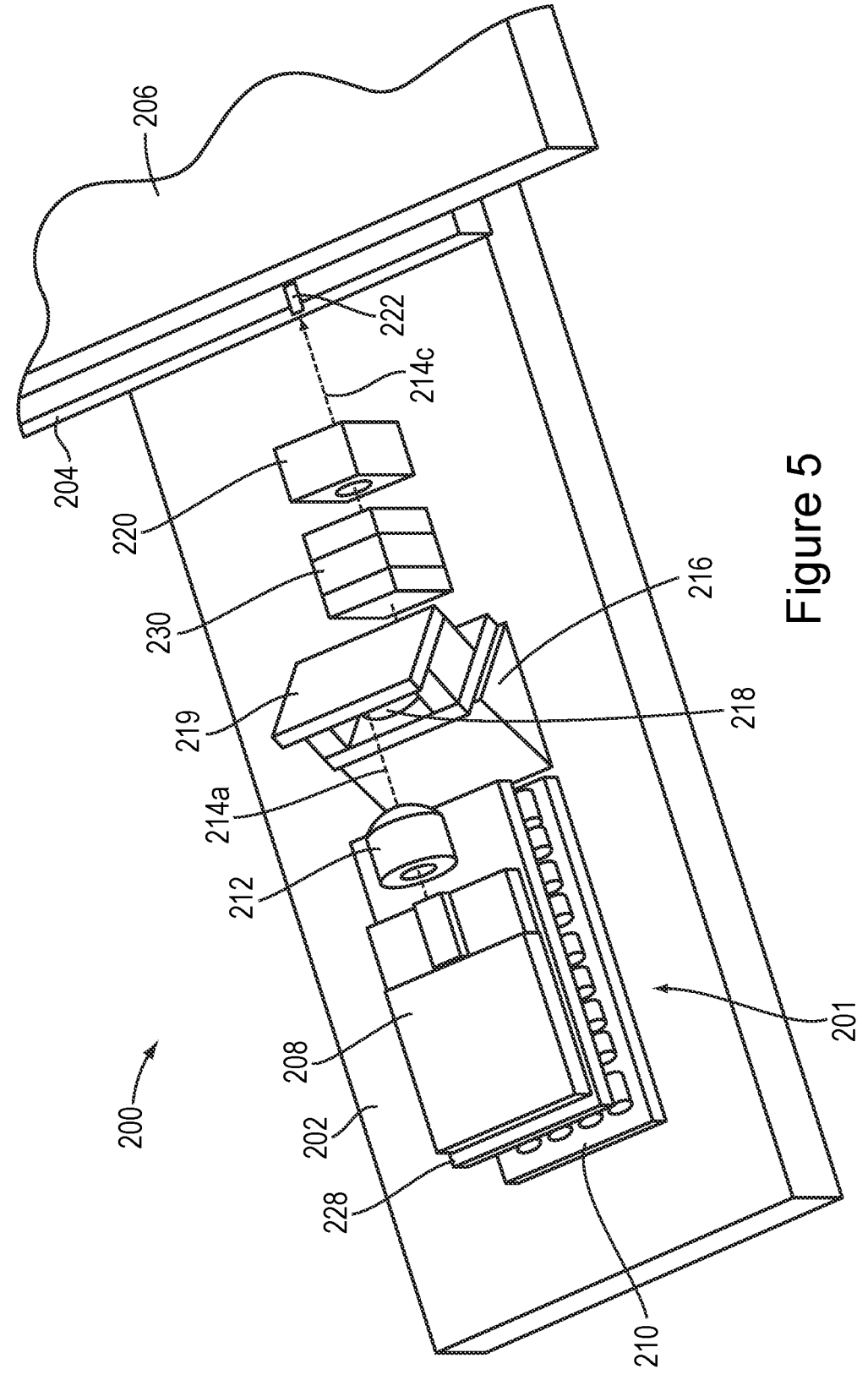
FIG. 5 is a perspective view of the single channel opto-electronic module shown in FIG. 3, according to an exemplary embodiment of the disclosure.

FIG. 3 is a sectional view of a single channel opto-electronic module 200 comprising MEMS micro-mirror device 216 positioned between a collimating lens 212 and a focusing lens 220, according to an exemplary embodiment of the disclosure. FIG. 4 is a detailed view of the single channel opto-electronic module 200 shown in FIG. 3, according to an exemplary embodiment of the disclosure. FIG. 5 is a perspective view of the single channel opto-electronic module 200, according to an exemplary embodiment of the disclosure. With reference now to FIGS. 3-5, the single channel opto-electronic module 200 comprises a first substrate 202. In one embodiment, the first substrate 202 can be an AlN/Silicon substrate. A PIC 204 comprises one side attached to the first substrate 202 and another, opposite, side attached to a second substrate 206. In one embodiment, the second substrate 206 can be an organic substrate. The second substrate 206 can be attached to a third substrate 224 by way of a ball grid array 226. In one embodiment, the third substrate 224 can be a printed circuit board (PCB). In one embodiment, the PIC 204 can be configured as a flip-chip for electrically interconnecting the PIC 204 to the first or second substrate 202, 206. In one embodiment, the single channel opto-electronic module 200 comprises a co-packaged laser assembly 201.

In one embodiment, the co-packaged laser assembly 201 comprises a thermo-electric cooler 210 (TEC) is attached to the first substrate 202. A laser 208 is attached to and thermally coupled to the TEC 210. During operation, the laser 208 generates an input laser beam 214a that passes through the collimating lens 212 and enters the MEMS micro-mirror device 216. The MEMS micro-mirror device 216 comprises an actuatable MEMS mirror 218 and a fixed mirror 219. The actuatable MEMS mirror 218 reflects the input laser beam 214a to produce a reflected laser beam 214b, which reflects off the fixed mirror 219 to produce an output laser beam 214c. The output laser beam 214c passes through the focusing 220 and enters the PIC 204 waveguide 222. In one embodiment, the output laser beam 214c passes through an optical isolator 230 positioned between the MEMS micro-mirror device 216 and the focusing 220. More particularly, in one embodiment, the optical isolator 230 is positioned between the fixed mirror 219 of the MEMS micro-mirror device 216 and the focusing lens 220. In other embodiments, the position of the actuatable MEMS mirror 218 and the fixed mirror 219 may be switched such that the input laser beam 214a initially reflects off the actuatable MEMS mirror 218 to produce a reflected laser beam 214b, which reflects off the fixed mirror 219 before the output laser beam 214c is coupled to the focusing lens 220.

In the embodiment illustrated in FIGS. 3-5, all optical elements are attached passively within about +/−25 μm positional accuracy with respect to fiducials on the first substrate 202. The actuatable MEMS mirror 218 can tilt in two axes, providing the ability to scan the input laser beam 214a in the vertical (Y axis) and horizontal (X axis) directions. The third axis (Z) is less sensitive optically and a passive alignment accuracy of 25 μm is sufficient. In another embodiment, the actuatable MEMS mirror 218 may be have an additional degree of freedom (DOF), referred to herein as pistoning, to compensate for the Z-axis as well. Accordingly, the actuatable MEMS mirror 218 can have one to three degrees of freedom to control pitch, yaw, and pistoning of the actuatable MEMS mirror 218 prior to adjust the output laser beam 214c into the focusing lens 220.

Once all the optical components (e.g., collimating lens 212, MEMS micro-mirror device 216, and focusing lens 220) are passively aligned, the actuatable MEMS mirror 218 may be actuated to scan the input laser beam 214a incident on the actuatable MEMS mirror 218 to align the output laser beam 214c for optimal coupling into the waveguide 222, by way of monitoring a photodiode on the PIC 204. A feedback scheme can be implemented, for instance by a slow dither of the actuatable MEMS mirror 218 to compensate for any shift of the input laser beam 214a that may occur due to thermo-mechanical forces over the life of the single channel opto-electronic module 200. A typical angular range required for scanning the input laser beam 214a is +/−2 degrees for +/−50 μm scanning.

In one embodiment, the actuatable MEMS mirror 218 is bi-directional in both axes, e.g., two electrodes for each axis, or four electrodes per channel. In one embodiment, the initial passive alignment can be biased to enable a unidirectional MEMS mirror, assuming twice the angular range. This has the advantage of reducing electrode count and simplifying the MEMS driver electronics. The actuatable MEMS mirror 218 can be configured to operate at <40V, for example, to simplify the MEMS driver electronics. In one embodiment, this may be accomplished by efficient staggered vertical comb (SVC) actuators, for example.

Figure 6:
FIG. 6 is a perspective view of a four channel opto-electronic module comprising actuatable MEMS micro-mirror device array positioned between a collimating lens and a focusing lens array as shown in FIGS. 3 and 4, according to an exemplary embodiment of the disclosure.

FIG. 6 is a perspective view of a four channel opto-electronic module 300 comprising MEMS micro-mirror device array 316 positioned between a collimating lens 312 and a focusing lens array 320, according to an exemplary embodiment of the disclosure. The four channel opto-electronic module 300 comprises four co-packaged laser assemblies 301a, 301b, 301c, 301d disposed on a first substrate 302. Each of the four co-packaged laser assemblies 301a-d couple the output laser beams 314c into waveguides of a PIC 304. In one embodiment, the first substrate 302 can be an AlN/Silicon substrate. The PIC 304 comprises one side attached to the first substrate 302 and another, opposite, side attached to a second substrate (not shown). In one embodiment, the second substrate can be an organic substrate. The second substrate can be attached to a third substrate (not shown) by way of a ball grid array (not shown). In one embodiment, the third substrate can be a printed circuit board (PCB). In one embodiment, the PIC 304 can be configured as a flip-chip for electrically interconnecting the PIC 304 to the first substrate 302 or second substrate (not shown).

Each of the four co-packaged laser assemblies 301a-d comprises a thermo-electric cooler 310 (TEC) attached to the first substrate 302 and a laser 308 attached to and thermally coupled to the TEC 310. During operation, each of the lasers 308 generate an input laser beam 314a that passes through a collimating lens 312 and enters a MEMS micro-mirror device array 316. The MEMS micro-mirror device array 316 comprises four actuatable MEMS mirrors 318a, 318b, 318c, 318d, one for each channel and independently actuatable, and a fixed mirror 319. Each of the four actuatable MEMS mirrors 318a-d reflects the input laser beam 314a to produce a reflected laser beam 314b, which reflects off the fixed mirror 319 to produce an output laser beam 314c. The output laser beam 314c passes through a focusing lens array 320 comprising four separate focusing lenses 320a, 320b, 320c, 320d, one for each channel coupled to the PIC 304 waveguides (not shown). In one embodiment, the output laser beam 314c passes through optical isolators 330 positioned between the MEMS micro-mirror device 316 and the focusing lens array 320. More particularly, in one embodiment, the optical isolators 330 are positioned between the fixed mirror 319 of the MEMS micro-mirror device 316 and the focusing lens array 320. In other embodiments, the position of the actuatable MEMS mirrors 318a-d and the fixed mirror 319 may be switched such that the input laser beam 314a initially reflects off the actuatable MEMS mirrors 318a-d to produce a reflected laser beam 314b, which reflects off the fixed mirror 319 to produce an output laser beam 314c before it is coupled to the focusing lens array 320. It will be appreciated that although the fixed mirror 319 is shown as a single unit, it is contemplated that embodiments can include separate individual fixed mirrors to reflect the laser beam. Similarly, the focusing lens array 320 can be replaced with individual focusing lenses to couple the output laser beam 314c to PIC 304 waveguide (not shown).

In the embodiment illustrated in FIG. 6, all optical elements are attached passively within about +/−25 μm positional accuracy with respect to fiducials on the first substrate 302. Each of actuatable MEMS mirrors 318a-d can tilt in two axes, providing the ability to scan the input laser beam 314a in the vertical (Y axis) and horizontal (X axis) directions. The third axis (Z) is less sensitive optically and a passive alignment accuracy of 25 μm is sufficient. In another embodiment, each of the actuatable MEMS mirrors 318a-d may have an additional degree of freedom (DOF), referred to herein as pistoning, to compensate for the Z-axis as well. Accordingly, each of the actuatable MEMS mirrors 318a-d can have one to three degrees of freedom to control pitch, yaw, and pistoning of the MEMS mirrors 318a-d prior to adjust the output laser beam 314c into the focusing lens array 320.

Once all the optical components (e.g., collimating lens 312, MEMS micro-mirror device array 316, and focusing array 320) are passively aligned, each of the actuatable MEMS mirrors 318a-d may be actuated to scan the input laser beam 314a incident on each of the actuatable MEMS mirrors 318a-d to align the output laser beams 314c for optimal coupling into the waveguide (not shown), by way of monitoring a photodiode on the PIC 304. A feedback scheme can be implemented, for instance by a slow dither of the actuatable MEMS mirrors 318a-d to compensate for any shift of the input laser beam 314a that may occur due to thermo-mechanical forces over the life of the four channel opto-electronic module 300. A typical angular range required for scanning the input laser beam 314a is +/−2 degrees for +/−50 um scanning.

In one embodiment, each of the actuatable MEMS mirrors 318a-d is bi-directional in both axes, e.g., two electrodes for each axis, or four electrodes per channel. In one embodiment, the initial passive alignment can be biased to enable a unidirectional MEMS mirror, assuming twice the angular range. This has the advantage of reducing electrode count and simplifying the MEMS driver electronics. Each of the actuatable MEMS mirrors 318a-d can be configured to operate at <40V, for example, to simplify the MEMS driver electronics. In one embodiment, this may be accomplished by efficient staggered vertical comb (SVC) actuators, for example.

Figure 7:
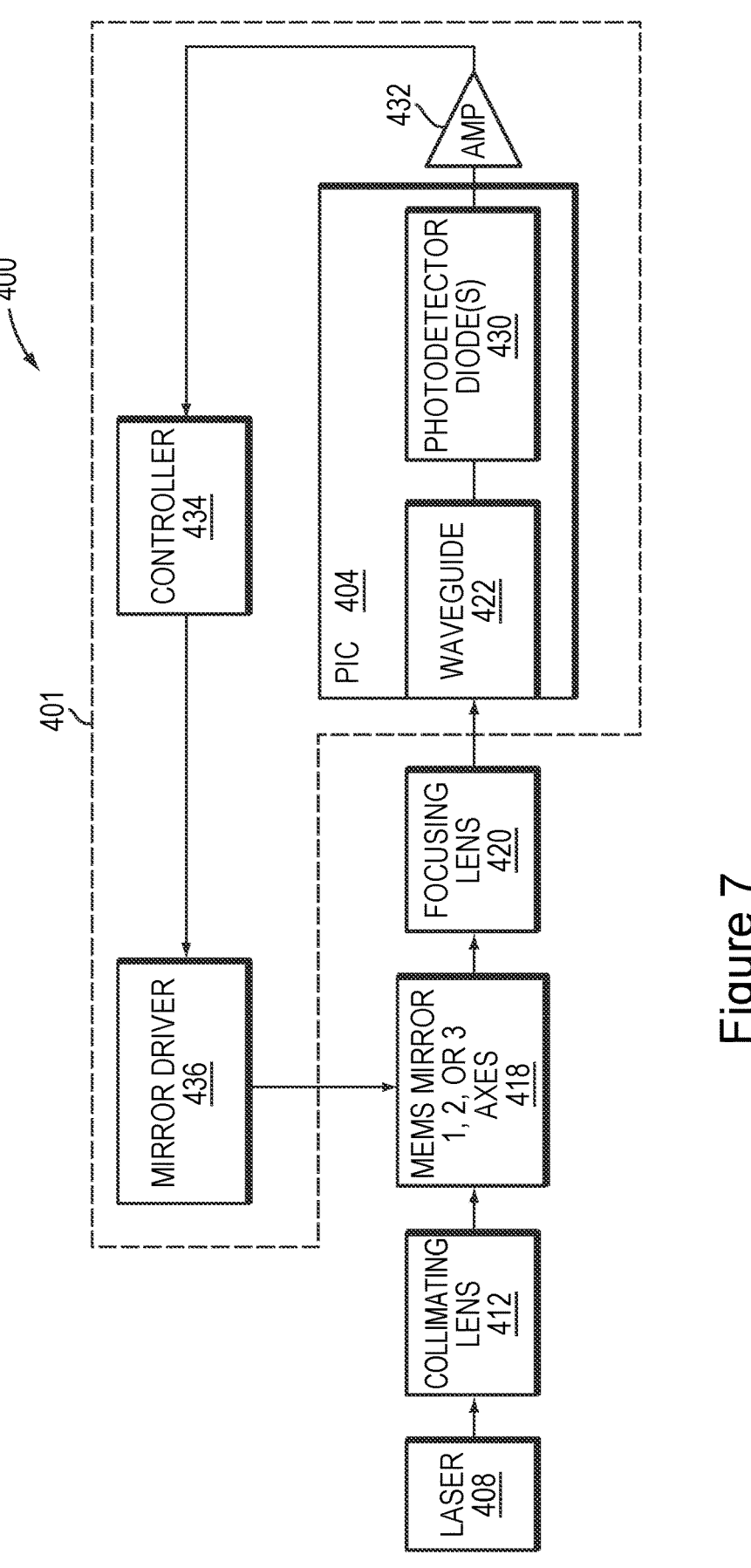
FIG. 7 is a block diagram of an opto-electronic module comprising a MEMS micro-mirror device control circuit, according to an exemplary embodiment of the disclosure.

FIG. 7 is a block diagram of an opto-electronic module 400 comprising a MEMS micro-mirror device control circuit 401, according to an exemplary embodiment of the disclosure. The control system is configured to adjust an actuatable MEMS mirror 418 in 1, 2, or 3 axes. The actuatable MEMS mirror 418 receives a laser beam generated by a laser 408 and passed through a collimating lens 412. The actuatable MEMS mirror 418 reflects the laser beam to a fixed mirror, which is optically coupled to a focusing lens 420. The laser beam is then coupled to a waveguide 422 in a PIC 404. Photodetector diode(s) 430 in the PIC 404 monitor the laser beam coupled by the waveguide 422. The output of the photodetector diode(s) 430 is amplified by amplifier 432. The output of the amplifier 432 is provided to a controller 434 which determines how the actuatable MEMS mirror 418 should be adjusted to align the laser beam and optimally couple the laser beam into the waveguide 422.

The controller 434 controls the mirror driver 436, which applies the compensating current to electrodes on the actuatable MEMS mirror 418 to scan the input laser beam incident on the actuatable MEMS mirror 418 to align the output laser beam for optimal coupling into the waveguide 422, by way of monitoring the photodetector diode(s) 430 on the PIC 404. The feedback scheme can be implemented by a slow dither of the actuatable MEMS mirror 418 to compensate for any shift of the laser beam that may occur due to thermo-mechanical forces over the life of the opto-electronic module 400. A typical angular range required for scanning the laser beam is +/−2 degrees for +/−50 um scanning.

In one embodiment, the actuatable MEMS mirror 418 is bi-directional in both axes, e.g., two electrodes for each axis, or four electrodes per channel. In one embodiment, the initial passive alignment can be biased to enable a unidirectional MEMS mirror, assuming twice the angular range. This has the advantage of reducing electrode count and simplifying the MEMS driver electronics. The actuatable MEMS mirror 418 can be configured to operate at <40V, for example, to simplify the MEMS driver electronics. In one embodiment, this may be accomplished by efficient staggered vertical comb (SVC) actuators, for example.

In one embodiment, the MEMS mirrors described herein may employ electrostatic actuators. Low power consumption is one advantage of a MEMS mirror comprising an electrostatic actuator. In one embodiment, an electrostatic MEMS mirror may comprise a comb drive actuator for low voltage operation. In other embodiments, the MEMS mirrors described herein may comprise electrothermal, piezoelectric, electromagnetic, and/or shape memory alloy (SMA) based actuators.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112(f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. An opto-electronic module, comprising:
a first substrate;
a photonic integrated circuit (PIC) attached to the first substrate, the PIC comprising a waveguide;
a laser assembly attached to the first substrate, the laser assembly configured to generate a laser beam to optically couple to the waveguide, the laser assembly comprising:
a thermal electric cooler (TEC); and
a laser thermally coupled to the TEC; and
a microelectromechanical systems (MEMS) micro-mirror device positioned between the laser and the waveguide, the MEMS micro-mirror device comprising an actuatable MEMS mirror and a fixed mirror.

2. The opto-electronic module of claim 1, wherein the actuatable MEMS mirror is configured to reflect an incident laser beam to the fixed mirror and the fixed mirror is configured to reflect an incident laser beam into the waveguide at a side edge of the PIC.

3. The opto-electronic module of claim 1, wherein the fixed mirror is configured to reflect an incident laser beam to the actuatable MEMS mirror and the actuatable MEMS mirror is configured to reflect an incident laser beam into the waveguide at a side edge of the PIC.

4. The opto-electronic module of claim 1, wherein the laser assembly comprises a collimating lens optically coupled to the laser and positioned between the laser and the MEMS micro-mirror device.

5. The opto-electronic module of claim 1, comprising a focusing lens positioned between the MEMS micro-mirror device and the waveguide, wherein the focusing lens is configured to focus the laser beam into the waveguide.

6. The opto-electronic module of claim 5, comprising an optical isolator positioned between the MEMS micro-mirror device and the focusing lens.

7. The opto-electronic module of claim 5, wherein the actuatable MEMS mirror has one, two, or three degrees of freedom to adjust the laser beam into the focusing lens.

8. The opto-electronic module of claim 1, comprising:
a photodetector coupled to the waveguide;
a controller coupled to the photodetector; and
a mirror driver coupled to the controller and to the actuatable MEMS mirror.

9. The opto-electronic module of claim 8, wherein the photodetector is configured to monitor the laser beam coupled by the waveguide and provide a signal to the controller to adjust the actuatable MEMS mirror to align the laser beam into the waveguide.

10. The opto-electronic module of claim 9, wherein the controller is configured to control the mirror driver to apply a compensating current or voltage to electrodes on the actuatable MEMS mirror to scan a laser beam incident on the actuatable MEMS mirror to align the laser beam into the waveguide.

11. An opto-electronic module, comprising:
a first substrate;
a photonic integrated circuit (PIC) attached to the first substrate, the PIC comprising a waveguide;
a plurality of laser assemblies attached to the first substrate, wherein each of the plurality of laser assemblies is configured to generate a laser beam to optically couple to the waveguide, each of the plurality of laser assemblies comprising:
a thermal electric cooler (TEC); and
a laser thermally coupled to the TEC; and
a plurality of microelectromechanical systems (MEMS) micro-mirror devices, wherein each of the plurality of MEMS micro-mirror devices is positioned between the laser and the waveguide, each of the plurality of MEMS micro-mirror devices comprising an actuatable MEMS mirror and a fixed mirror.

12. The opto-electronic module of claim 11, wherein each of the plurality of the actuatable MEMS mirrors is configured to reflect an incident laser beam to the fixed mirror and the fixed mirror is configured to reflect an incident laser beam into the waveguide.

13. The opto-electronic module of claim 11, wherein each of the plurality of fixed mirrors is configured to reflect an incident laser beam to the actuatable MEMS mirror and the actuatable MEMS mirror is configured to reflect an incident laser beam into the waveguide.

14. The opto-electronic module of claim 11, comprising a plurality of collimating lenses, wherein at least one of the plurality of collimating lenses is optically coupled to at least one of the plurality of lasers and positioned between the at least one of the plurality of lasers and at least one of the plurality of the MEMS micro-mirror devices.

15. The opto-electronic module of claim 11, comprising a plurality of focusing lenses, wherein at least one of the plurality of focusing lenses is positioned between at least one of the plurality of the MEMS micro-mirror devices and the waveguide, wherein at least one of the focusing lenses is configured to focus the laser beam into the waveguide.

16. The opto-electronic module of claim 15, comprising a plurality of optical isolators, wherein at least one of the plurality of optical isolators is positioned between at least one of the MEMS micro-mirror devices and at least one of the focusing lenses.

17. The opto-electronic module of claim 15, wherein the actuatable MEMS mirror has one, two, or three degrees of freedom to adjust the laser beam into at least one of the plurality of focusing lenses.

18. An opto-electronic module, comprising:

a first substrate;

a photonic integrated circuit (PIC) attached to the first substrate, the PIC comprising a waveguide;

a plurality of laser assemblies attached to the first substrate, wherein each of the plurality of laser assemblies is configured to generate a laser beam to optically couple to the waveguide, each of the plurality of laser assemblies comprising:

a thermal electric cooler (TEC); and a laser thermally coupled to the TEC;

a plurality of microelectromechanical systems (MEMS) micro-mirror devices, wherein each of the plurality of MEMS micro-mirror devices is positioned between the laser and the waveguide, each of the plurality of MEMS micro-mirror devices comprising an actuatable MEMS mirror and a fixed mirror;

a plurality of photodetectors coupled to the waveguide;

a controller coupled to the plurality of photodetectors; and a plurality of mirror drivers coupled to the controller, wherein at least one of the plurality of mirror drivers is coupled to at least one of the actuatable MEMS mirrors.

19. The opto-electronic module of claim 18, wherein at least one of the photodetectors is configured to monitor at least one of the laser beams coupled by the waveguide and provide a signal to the controller to adjust at least one of the actuatable MEMS mirrors to align the at least one of the laser beams into the waveguide.

20. The opto-electronic module of claim 19, wherein the controller is configured to control at least one of the plurality of mirror drivers to apply a compensating current or voltage to electrodes on at least one of the actuatable MEMS mirrors to scan at least one laser beam incident on the at least one of the actuatable MEMS mirrors to align the at least one of the laser beams into the waveguide.

* * * * *